United States Patent
Bellosguardo et al.

(10) Patent No.: US 11,934,088 B2
(45) Date of Patent: Mar. 19, 2024

(54) LIGHT-EMITTING SYSTEMS INCLUDING DUAL PRIMARY RED LEDS

(71) Applicant: Luminus, Inc., Sunnyvale, CA (US)

(72) Inventors: Stephane Bellosguardo, Pleasanton, CA (US); Jinhui Zhai, Union City, CA (US); Mark Pugh, Los Gatos, CA (US)

(73) Assignee: Luminus, Inc., Sunnyvale, CA (US)

( * ) Notice: Subject to any disclaimer, the term of this patent is extended or adjusted under 35 U.S.C. 154(b) by 0 days.

(21) Appl. No.: 17/355,736

(22) Filed: Jun. 23, 2021

(65) Prior Publication Data

US 2022/0050370 A1 Feb. 17, 2022

Related U.S. Application Data

(60) Provisional application No. 63/043,083, filed on Jun. 23, 2020.

(51) Int. Cl.
  *G03B 21/20* (2006.01)
  *G03B 21/00* (2006.01)
  *G03B 33/12* (2006.01)

(52) U.S. Cl.
  CPC ......... *G03B 21/204* (2013.01); *G03B 21/006* (2013.01); *G03B 21/008* (2013.01); *G03B 21/2013* (2013.01); *G03B 33/12* (2013.01)

(58) Field of Classification Search
  CPC .... G03B 21/006; G03B 21/008; G03B 21/28; G03B 21/145; G03B 21/204; G03B 21/2013; G03B 21/2033; G03B 21/2053; G03B 33/06; G03B 33/08; G03B 33/12; H04N 9/315; H04N 9/3114; H04N 9/3141; H04N 9/3155; H04N 9/3161; H04N 9/3164
  See application file for complete search history.

(56) References Cited

U.S. PATENT DOCUMENTS

| | | | |
|---|---|---|---|
| 8,680,550 B2 | 3/2014 | Kim et al. | |
| 9,846,353 B2* | 12/2017 | Kilcher | G02B 26/0833 |
| 2007/0263678 A1 | 11/2007 | Mizuuchi et al. | |
| 2010/0327306 A1 | 12/2010 | Van Der Burgt et al. | |
| 2016/0223893 A1* | 8/2016 | Okuda | H04N 9/3161 |
| 2017/0084671 A1 | 3/2017 | Hack et al. | |
| 2017/0219885 A1* | 8/2017 | Tanaka | G02F 1/133603 |
| 2019/0187544 A1* | 6/2019 | Liao | G02B 27/1026 |
| 2019/0252578 A1 | 8/2019 | Zhai | |
| 2019/0319016 A1* | 10/2019 | Zhang | H01L 33/505 |
| 2019/0394429 A1* | 12/2019 | Tanaka | H04N 9/3167 |
| 2020/0192208 A1* | 6/2020 | Chang | G03B 21/206 |
| 2020/0224854 A1* | 7/2020 | Jurik | F21V 9/40 |
| 2021/0203895 A1* | 7/2021 | Okuno | G03B 33/12 |
| 2021/0373429 A1* | 12/2021 | Zhai | G03B 21/16 |

OTHER PUBLICATIONS

International Search Report and Written Opinion for International Application No. PCT/US2021/038666 dated Oct. 28, 2021.

* cited by examiner

*Primary Examiner* — Sultan Chowdhury
(74) *Attorney, Agent, or Firm* — Wolf, Greenfield & Sacks, P.C.

(57) ABSTRACT

Light-emitting systems (e.g., projection systems) that comprise multiple light-emitting diodes (LEDs) are described herein. For example, the systems may include dual (i.e., two) primary red LEDs.

19 Claims, 3 Drawing Sheets

LIGHT-EMITTING SYSTEMS INCLUDING DUAL PRIMARY RED LEDS

RELATED APPLICATIONS

This application claims priority to U.S. Provisional Application No. 63/043,083, filed Jun. 23, 2020, which is incorporated herein by reference in its entirety.

TECHNICAL FIELD

The present invention relates to light-emitting systems (e.g., projection systems) that comprise multiple light-emitting diodes (LEDs).

BACKGROUND

Projector systems may utilize light-emitting diodes (LEDs) as their light source. For example, a projector may utilize an array of Red-Green-Blue (RGB) LEDs. Such projectors may optically combine each of these primary colors (i.e., red, green and blue) with each primary color being modulated by a micro-display device (e.g., digital light processors (DLP)) to deliver a projected image.

Operation of each of the LEDs may be independently optimized, for example depending on the intensity of each of the emitted light(s), to produce a projected image having desired characteristics (e.g., desired white point and brightness). For example, to maximize brightness of the projected image, it can be desirable to maximize the duty cycle of the green LEDs because the green LEDs contribute the most lumens. On the other hand, the performance of the red LEDs (e.g., with dominant wavelengths in the range of 605 nm to 630 nm) often limit the brightness of the projected image because the quantum efficiency of red LEDs reduces significantly as temperatures increase, e.g., during operation.

Furthermore, a top-side pumping blue channel is added to pump the green phosphor plate of green LEDs in projector system of current market projector, which can increase green LED brightness over 40%. In these systems, the duty cycle of the red LEDs need to be significantly increased and the green LEDs duty cycle is reduced in order to produce the desired whit point. So there is a need to solve the red LED brightness shortage issue in the green LED brightness enhanced projector system.

Accordingly, innovations that address the deficiencies of red LED performance in projector systems would be advantageous.

SUMMARY

Light-emitting systems (e.g., projection systems) that comprise multiple light-emitting diodes (LEDs) are described herein. For example, the systems may include dual (i.e., two) primary red LEDs.

In one aspect, a light-emitting system is provided. The system comprises a first LED-based light source configured to emit blue light; a second LED-based light source configured to emit green light; a third LED-based light source configured to emit red light having a peak wavelength between 605 nm-630 nm; and a fourth LED-based light source configured to emit deep red light having a peak wavelength between 640 nm-665 nm. The system further comprises a micro-display device configured to receive light from the LED-based light sources and to produce output light.

In some embodiments, the second LED-based light source includes an LED chip configured to emit blue light and a wavelength converting material configured to absorb the blue light emitted from the chip and to emit green light.

In some embodiments, the light-emitting system further comprises an optional LED-based pump configured to emit blue light that is absorbed by the wavelength converting material of the second LED-based light source (e.g., from the top side of the LED).

In some embodiments, the light-emitting system further comprises a first wavelength combining element (e.g., a dichroic mirror). The first wavelength combining element may be configured to combine the green light and the blue light to produce co-axial green and blue beams. In some cases, the first wavelength combining element may be configured to reflect the green light and to transmit the blue light to produce the co-axial green and blue beams.

In some embodiments, the light-emitting system further comprises a second wavelength combining element. The second wavelength combining element may be configured to combine the red light and the deep red light to produce a co-axial primary red beam. In some cases, the second wavelength combining element may be configured to transmit the red light and to reflect the deep red light to produce the co-axial primary red beam. In some cases, the second wavelength combining element may be configured to combine the red light and the co-axial primary green and blue beams to produce co-axial red, green and blue beams.

In some embodiments, the light-emitting system further comprising a third wavelength combining element. The third wavelength combining element may be configured to combine the co-axial dual primary red beam and the co-axial green and blue beams to produce co-axial primary red, green and blue beams. In some cases, the third wavelength combining element may be configured to transmit the green light and the blue light and to reflect the red light and the deep red light to produce the co-axial primary red, green and blue beams. In some cases, the third wavelength combining element may be configured to combine the co-axial red, green and blue beams and the deep red light to produce co-axial primary red, green and blue beams. In some cases, the third wavelength combining element may be configured to reflect the deep red light and to transmit the co-axial red, green and blue beams to produce co-axial primary red, green and blue beams.

In some embodiments, the light-emitting system further comprises one or more optical elements configured to receive light and focus and/or collimate light.

In some embodiments, the micro-display device comprises a plurality of a micromirrors to produce output light.

In some embodiments, the micro-display device comprises a liquid crystal on silicon (LCOS) panel to produce output light through a polarization beam splitter prism.

In some embodiments, the light-emitting system further comprises a projection lens system configured to receive light from the micro-display device and to project the output light.

In some embodiments, the light-emitting system does not include any LED-based light sources that emit light other than red, deep red, green and blue light.

In some embodiments, the light-emitting system includes only four different types of LED-based light sources.

In some embodiments, the light-emitting system is a projection system.

Other aspects, embodiments and features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Light-emitting systems including multiple light-emitting diodes (LEDs) and related methods are described herein. The systems may utilize an arrangement of RGB LEDs (which includes a conventional red LEDs (e.g., AlInGaP red LED) (peak wavelength 605 nm-635 nm), a conventional green LEDs and a conventional blue LED) as well as a deep-red LED (peak wavelength between 640 nm and 665 nm). For example, light emitted from the deep-red LED may be combined with light emitted from the RGB LEDs. The addition of the deep-red LED to the RGB LEDs forms a so-called "dual primary red" configuration which may be used in 4-channel or 5-channel light engine architectures. Such configurations may significantly increase the optical output of the red channel because the deep-red LED may be driven at a higher power and corresponding higher brightness. The use of the deep-red LED may also enable reduction of the duty cycle of the red channel which can enable an increase to the duty cycle of the green channel. The increased duty cycle of the green channel can correspondingly increase the brightness of light emitted from the green channel and, thus, increase the brightness of the projected image. Both the combined effects of increasing red channel brightness and green channel brightness can result in significant increases to overall system level performance (e.g., brightness gains of 15% or greater or greater than 24%). Another benefit of the dual primary red configuration is to improve the color gamut of the system which results in a better image quality. As described further below, the light-emitting systems may be used as a projector which further includes a micro-display device (e.g., digital light processor (DLP), or liquid crystal on silicon (LCOS) panel) which modulates each of the primary colors (i.e., red, green and blue) to deliver a projected image.

Figure 1:
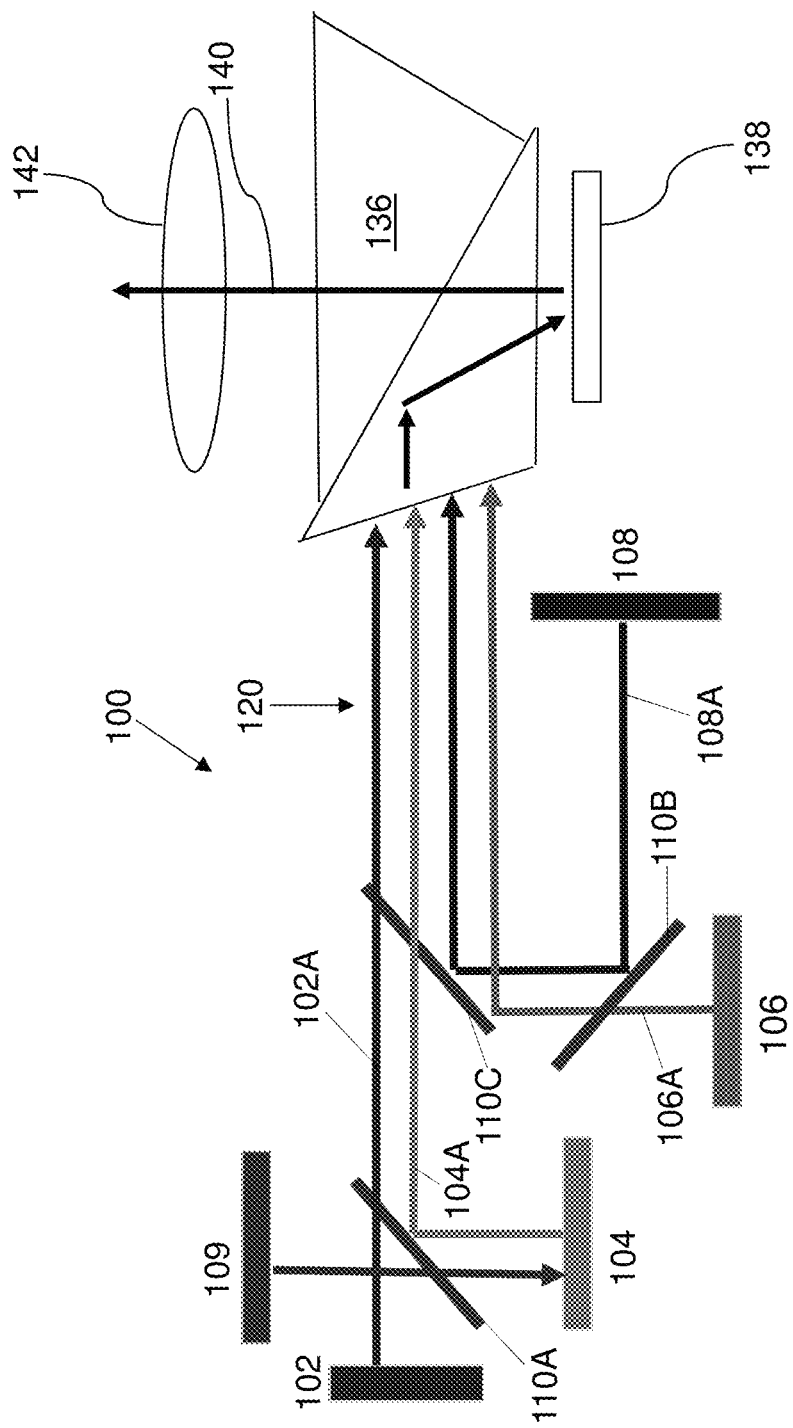
FIG. 1 schematically shows a light-emitting system according to certain embodiments.

FIG. 1 illustrates a light-emitting system 100 which can function as a projection system according to some embodiments. The system includes a blue LED-based light source 102, a green LED-based light source 104, a red LED-based light source 106 and a deep-red LED-based light source 108. As shown, the system optionally includes a light source 109 that functions as a top-side pump light which, for example may be blue LED-based. Each light source is configured to emit light that travels on respective optical pathways 102a, 104a, 106a, 108a, 109a. In some embodiments and, as shown, the light pathways pass through (e.g., at an incident angle of 45 degrees) wavelength-combining elements 110a, 110b, 110c. As described further below, the wavelength-combining elements can combine light of different wavelengths to form co-axial light beam(s). Ultimately, when the system is used as a projection system, the co-axial light beam 120 including red, deep-red, green and blue light is transmitted to a micro-mirror optics element 136 which projects the co-axial light beam onto a micro-display panel 138. The co-axial light beam is reflected by the micro-display panel 138 to produce output light 140. In the illustrative embodiment, the output light enters a projection lens system 142 which projects the light as desired (e.g., on to a screen, a wall, etc.).

Figure 2:
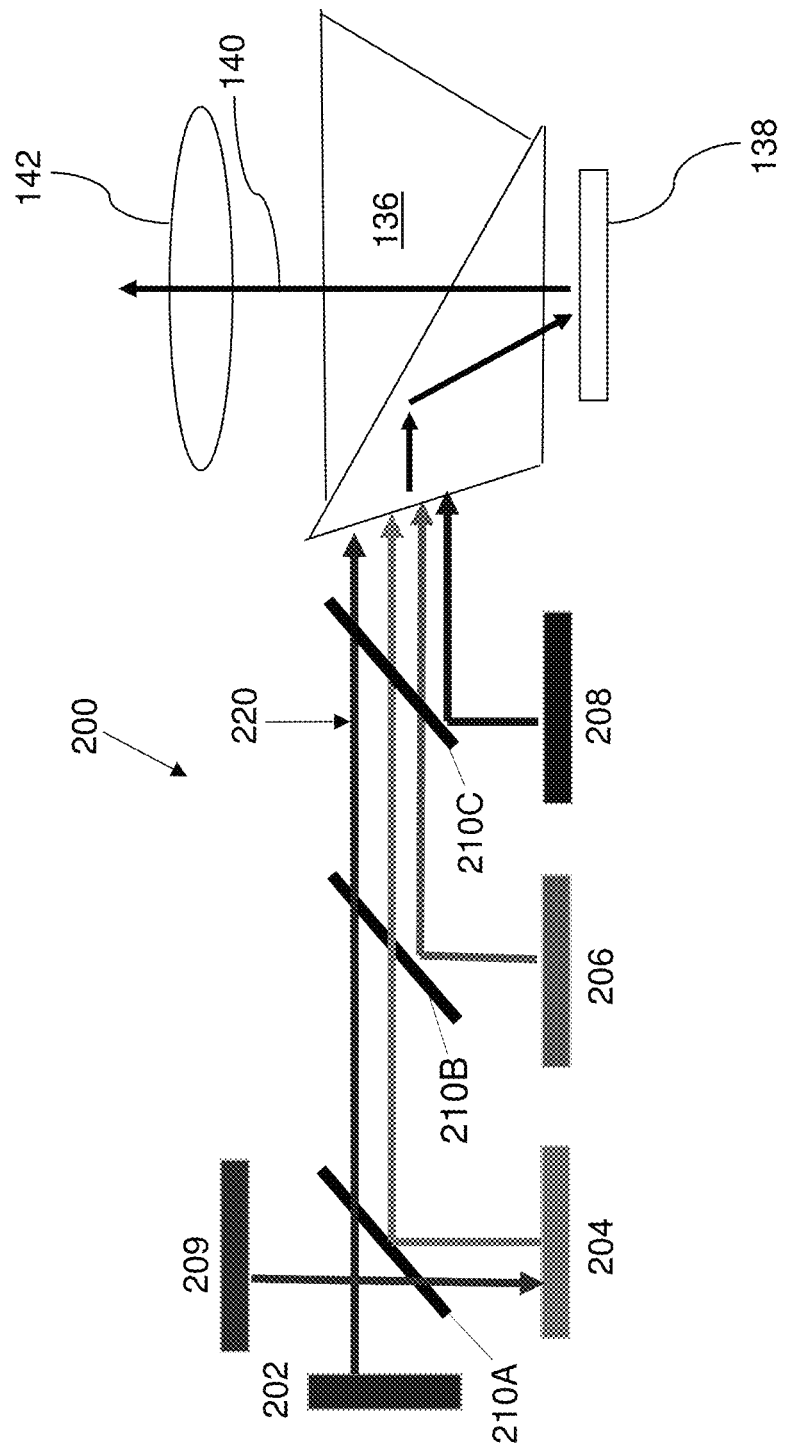
FIG. 2 schematically shows another light-emitting system according to certain embodiments.

It should be understood that the light-emitting systems described herein may include additional components not shown in FIG. 1 (and/or FIG. 2). For example, the systems may include additional optical elements (such as a lens) through which light passes. In some embodiments, the optical elements may be configured to collimate light. In some embodiments, the optical element(s) may be configured to focus light, for example, to control beam size. In some embodiments, the system includes one or more condenser optics element which, for example, may homogenize the light beam(s).

Also, it should be understood that the light-emitting systems may not include all of the components (e.g., pump 109) shown in FIG. 1 (and/or FIG. 2).

LED-based light sources 102, 104, 106, 108, 109 include respective LED chips that emit light of the desired wavelength. In some embodiments, the light source(s) include a single chip and, in other embodiments, the light source(s) include an array of more than one chip that emits the same type of light. The one or more chips may be mounted on a package using conventional techniques. It should be understood that, in general, commercially available LEDs can be used in the systems described herein. In some embodiments, the systems may include only red, deep-red, green and blue light sources (and/or LEDs). That is, the systems do not need to utilize additional light sources and/or LEDs (e.g., amber emitting light sources and/or LEDs).

The LED chip(s) include a light generating region comprised of one or more semiconductor material layers (e.g., which may be formed of III-V semiconductor materials). As known to those skilled in the art, the composition and arrangement of the material layers may be selected to generate light having the desired wavelength. For example, in some embodiments, the red LED-based light source includes a chip that comprises AlInGaP material(s). The light generated is emitted through one or more emission surfaces of the chip. In some cases, the wavelength of the light initially generated by the chip is converted to a different desired wavelength by a wavelength-converting material (e.g., a phosphor material). For example, the chip may initially generate blue light which is converted to green light by a wavelength-converting material (e.g., a phosphor material) that is incorporated into the green LED-based light source.

The wavelength-converting material is a luminescent material which can absorb primary light and emit secondary light at a different wavelength. For example, the luminescent material may absorb primary light having relatively short wavelength (e.g., blue light) and emit secondary light having a longer wavelength (e.g., green light). Examples of suitable luminescent materials include phosphors. Any suitable phosphor material may be used. In some embodiments, the phosphor material may be a yellow phosphor material (e.g., $(Y,Gd)(Al,Ga)G:Ce^{3+}$, sometimes referred to as a "YAG" (yttrium, aluminum, garnet) phosphor), a red phosphor material (e.g., wide bandwidth red nitride phosphor, narrow bandwidth red nitride phosphor such as KSF phosphor, $Eu^{2+}/Mn^{4+}$ doped red phosphor), a green phosphor material (e.g., ZnS:Cu,Al,Mn, $Lu_3Al_5O_{12}:Ce^{3+}$ (LuAG)), and/or a blue phosphor material.

The wavelength-converting material may be in the form of a plate (e.g., a ceramic), or a film, or a slurry coating that is separately manufactured and attached to the chip.

In some embodiments, the wavelength-converting material may be in the form of quantum dots. The quantum dots can be distributed in a second material (e.g., an encapsulant or adhesive, such as epoxy, or an insulator, such as glass) to form a composite structure. For example, the quantum dots can be formed of group IV semiconductors (e.g., silicon, germanium), III-V semiconductors, II-VI semiconductors, and combinations thereof. In some embodiments, the quantum dots are red-emitting CdSe/CdS core/shell quantum dots and/or Cd-free quantum dots.

As shown in FIG. 1, the system includes several wavelength-combining elements 110a, 110b, 110c through which respective light pathways pass. The wavelength-combining elements can combine light of different wavelengths to form co-axial light beam(s). In some embodiments, the wavelength-combining elements are configured to reflect light having certain wavelength(s) and to transmit light having other certain wavelength(s). For example, wavelength-combining element 110a is configured to transmit blue light from source 102 (and pump 109, when present) and to reflect green light from source 104 to form a co-axial beam that includes green and blue light. In the illustrative embodiment, wavelength-combining element 110b is configured to transmit red light from source 106 and to reflect green light from source 104 to form a co-axial beam that includes the red light and deep red light. As shown, wavelength-combining element 110c is configured to transmit the co-axial green and blue light beams and to reflect co-axial red and deep red light beams to form co-axial beam 120 of all four types of light (red, deep-red, green, blue).

It should be understood that wavelength-combining elements may have other configurations and/or may be arranged differently than as those described in connection with FIG. 1. The particular configurations and arrangements will depend on the design of the specific system.

In general, the wavelength-combining elements may have any suitable configuration known in the art to achieve their desired performance. In some embodiments, the wavelength-combining elements may be a substrate that is coated with a dichroic (e.g., to form a dichroic mirror) and/or multi-layer film. In some embodiments, the wavelength-combining element may be a filter.

FIG. 2 illustrates another light-emitting system 200 which can function as a projection system according to some embodiments. Similar to FIG. 1, the system includes a blue LED-based light source 202, a green LED-based light source 204, a red LED-based light source 206, a deep-red LED-based light source 208 and an optional light source 109 that functions as a top-side pump light which, for example may be blue LED-based. As described further below, system 200 has certain differences as compared to system 100 with respect to the arrangement of certain light sources as well as the arrangement and configuration of certain wavelength-combining elements.

As shown in FIG. 2, similar to as in light-emitting system 200, wavelength-combining element 210a is configured to transmit blue light from source 202 (and pump 209, when present) and to reflect green light from source 204 to form a co-axial beam that includes green and blue light. In the illustrative embodiment, wavelength-combining element 210b is configured to transmit green and blue light and to reflect red light from source 206 to form a co-axial beam that includes the red, green and blue light. As shown, wavelength-combining element 210c is configured to transmit the co-axial red, green and blue light beams and to reflect co-axial deep red light beam to form co-axial beam 220 of all four types of light (red, deep-red, green, blue).

Figure 3:
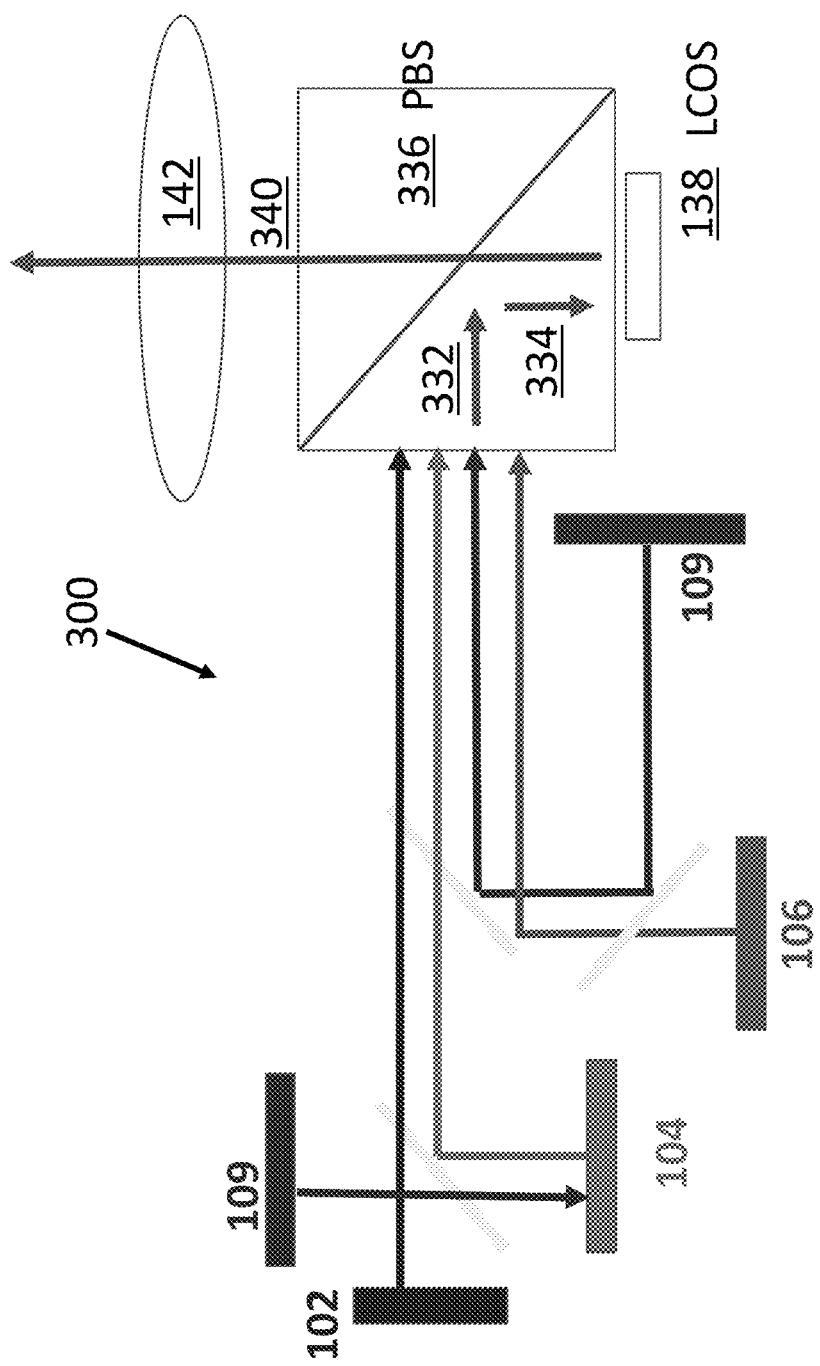
FIG. 3 schematically shows another light-emitting system according to certain embodiments.

FIG. 3 illustrates another light-emitting system 300 which can function as a liquid crystal on silicon (LCOS) projection system according to some embodiments. Similar to FIG. 1, the system includes a blue LED-based light source 102, a green LED-based light source 104, a red LED-based light source 106, a deep-red LED-based light source 108 and an optional light source 109 that functions as a top-side pump light which, for example may be blue LED-based. As shown in FIG. 3, similar to as in light-emitting system 100 (FIG. 1), the wavelength-combining elements can combine light of different wavelengths to form co-axial light beam(s). The co-axial light beam 120 including red, deep-red, green and blue light is entered a polarization beam splitter (PBS) 336 as co-axial light beam 332, when it is reflected at PBS, only S-polarization beam 334 is reflected at polarized coating surface of PBS and projects onto a micro-display panel 138, where the panel 138 is a liquid crystal on silicon(LCOS) panel, which liquid crystal layer is coated on high reflective silicon circuit substrate. The co-axial light beam is reflected by the micro-display panel 138 to produce output light 140, which is P-polarized beam and pass through PBS. In the illustrative embodiment, the output light enters a projection lens system 142 which projects the light as desired (e.g., on to a screen, a wall, etc.).

As noted above, use of the deep-red LED along with conventional RGB LEDs may enable a number of performance advantages. For example, the configuration may enable significant gains in optical output for the red channel. Such gains in Lumens maybe as large as 24% or even more. This significant increase the optical output of the red channel is because the deep-red LED may be driven at a higher power and corresponding higher brightness. The use of the deep-red LED may also enable reduction of the duty cycle of the red channel which can enable an increase to the duty cycle of the green channel. For example, the duty cycle of the red LED channel may be kept at about 30% or less and the duty cycle of the green LED channel may be kept about 45% or greater. The increased duty cycle of the green channel can correspondingly increase the brightness of light emitted from the green channel and, thus, increase the brightness of the projected image. Both the combined effects of increasing red channel brightness and green channel brightness can result in significant increases to overall system level performance (e.g., brightness gains of 15% or greater, or 20% or greater, compared to similar systems without utilizing the deep-red LEDs). Another benefit of the dual primary red configuration is to improve the color gamut of the system which results in a better image quality.

What is claimed is:

1. A light-emitting system, comprising:
   a first LED-based light source configured to emit blue light;
   a second LED-based light source configured to emit green light;

a third LED-based light source configured to emit red light having a peak wavelength between 605 nm-630 nm; and a fourth LED-based light source configured to emit deep red light having a peak wavelength between 640 nm-665 nm, a micro-display device configured to receive light from the LED-based light sources and to produce output light.

2. The light-emitting system of claim 1, wherein the second LED-based light source includes an LED chip configured to emit blue light and a wavelength converting material configured to absorb the blue light emitted from the chip and to emit converted green light.

3. The light-emitting system of claim 2, further comprising an optional LED-based pump configured to emit blue light that is absorbed by the wavelength converting material of the second LED-based light source.

4. The light-emitting system of claim 1, further comprising a first wavelength combining element.

5. The light-emitting system of claim 1, wherein the first wavelength combining element is configured to reflect the green light and to transmit the blue light to produce the co-axial green and blue beams.

6. The light-emitting system of claim 1, further comprising a second wavelength combining element.

7. The light-emitting system of claim 6, wherein the second wavelength combining element is configured to combine the red light and the deep red light to produce a co-axial dual primary red beam.

8. The light-emitting system of claim 7, wherein the second wavelength combining element is configured to transmit the red light and to reflect the deep red light to produce the co-axial dual primary red beam.

9. The light-emitting system of claim 6, wherein the second wavelength combining element is configured to combine the red light and the co-axial primary green and blue beams to produce co-axial red, green and blue beams.

10. The light-emitting system of claim 1, further comprising a third wavelength combining element.

11. The light-emitting system of claim 7, wherein the third wavelength combining element is configured to combine the co-axial dual primary red beam and the co-axial green and blue beams to produce co-axial primary red, green and blue beams.

12. The light-emitting system of claim 11, wherein the third wavelength combining element is configured to transmit the green light and the blue light and to reflect the red light and the deep red light to produce the co-axial primary red, green and blue beams.

13. The light-emitting system of claim 9, wherein the third wavelength combining element is configured to combine the co-axial red, green and blue beams and the deep red light to produce co-axial primary red, green and blue beams.

14. The light-emitting system of claim 13, wherein the third wavelength combining element is configured to reflect the deep red light and to transmit the co-axial red, green and blue beams to produce co-axial primary red, green and blue beams.

15. The light-emitting system of claim 1, wherein the micro-display device comprises a plurality of a micromirrors to produce output light.

16. The light-emitting system of claim 1, further comprising a projection lens system configured to receive light from the micro-display device and to project the output light.

17. The light-emitting system of claim 1, wherein the light-emitting system does not include any LED-based light sources that emit light other than red, deep red, green and blue light.

18. The light-emitting system of claim 1, wherein the light-emitting system includes only four different types of LED-based light sources.

19. The light-emitting system of claim 1, wherein the light-emitting system is projection system.

* * * * *